US010458717B2

(12) United States Patent
Davis et al.

(10) Patent No.: US 10,458,717 B2
(45) Date of Patent: Oct. 29, 2019

(54) FLEXIBLE HEAT SINK THERMOELECTIVE DEVICE

(71) Applicant: Magna Seating Inc, Aurora (CA)

(72) Inventors: Jason Davis, Commerce Township, MI (US); Artur Stepanov, Auburn Hills, MI (US); Eric Kozlowski, Oakland Township, MI (US)

(73) Assignee: Magna Seating Inc, Aurora, Ontario (*) Notice: Subject to any disclaimer, the term of this patent is extended or adjusted under 35 U.S.C. 154(b) by 93 days.

(21) Appl. No.: 15/650,000

(22) Filed: Jul. 14, 2017

(65) Prior Publication Data

US 2018/0017334 A1 Jan. 18, 2018

Related U.S. Application Data

(60) Provisional application No. 62/362,632, filed on Jul. 15, 2016.

(51) Int. Cl.

| | |
|---|---|
| ***F28D 15/02*** | (2006.01) |
| ***H01L 35/08*** | (2006.01) |
| ***F28F 3/02*** | (2006.01) |
| ***F28F 3/04*** | (2006.01) |
| ***F28F 3/06*** | (2006.01) |
| ***H01L 23/373*** | (2006.01) |
| ***H01L 35/30*** | (2006.01) |

(52) U.S. Cl.

CPC .......... *F28D 15/0241* (2013.01); *F28F 3/027* (2013.01); *F28F 3/042* (2013.01); *F28F 3/06* (2013.01); *H01L 23/373* (2013.01); *H01L 35/08* (2013.01); *H01L 35/30* (2013.01); *H01L 2924/01014* (2013.01)

(58) Field of Classification Search

CPC ..... F28D 15/0241; H01L 35/30; H01L 35/08; H01L 23/373; H01L 2924/01014; F28F 3/06; F28F 3/027; F28F 3/042

See application file for complete search history.

(56) References Cited

U.S. PATENT DOCUMENTS 5,653,280 A * 8/1997 Porter .................... F28F 13/00 165/185
6,009,937 A * 1/2000 Gonner .................... F28F 3/02 165/185
6,026,895 A * 2/2000 Moresco .................. F28F 3/02 165/185
6,257,314 B1 * 7/2001 Kuo .................. B22D 19/0063 164/333
6,367,541 B2 * 4/2002 McCullough ....... H01L 23/3672 165/185

(Continued)

*Primary Examiner* — Emmanuel E Duke
(74) *Attorney, Agent, or Firm* — Miller Canfield

(57) ABSTRACT

A flexible heat sink with a flexible base having a first side configured to engage a heat generating component, and a second side opposite the first side. A plurality of groups of fins extend from the second side of the base. The groups of fins are positioned in an array and spaced apart lengthwise and width wise across the base to enable the heat sink to flex lengthwise and width wise. The heat sink is able to flex lengthwise and width wise between the groups of fins. The fins and groups of fins also may provide some flex. The fins may define triangular, rectangular, or u-shaped channels to enable air flow through the heat sink.

10 Claims, 7 Drawing Sheets

110
122
120
124
130
140
100
140a
140b
140c
140d
140e

(56) References Cited

U.S. PATENT DOCUMENTS

| | | | | |
|---|---|---|---|---|
| 6,408,935 | B1 * | 6/2002 | DeHoff | H01L 23/3737 165/104.33 |
| 6,549,411 | B1 * | 4/2003 | Herbert | H01L 23/367 257/E23.102 |
| 6,919,504 | B2 | 7/2005 | McCutcheon et al. | |
| 7,399,919 | B2 | 7/2008 | McCutcheon et al. | |
| 8,736,048 | B2 | 5/2014 | Schultz | |
| 2002/0018338 | A1 * | 2/2002 | McCullough | H01L 21/4882 361/709 |
| 2004/0226707 | A1 * | 11/2004 | Sagal | F28F 3/02 165/185 |
| 2005/0061473 | A1 * | 3/2005 | Fletcher | F28D 9/0087 165/46 |
| 2005/0077618 | A1 * | 4/2005 | McCutcheon | F28D 15/0241 257/712 |

* cited by examiner

FLEXIBLE HEAT SINK THERMOELECTIVE DEVICE

CROSS-REFERENCE TO RELATED APPLICATIONS

This application claims priority to U.S. Provisional Application No. 62/362,632, filed on Jul. 15, 2016 and entitled "Flexible Heat Sink For Thermoelectric Device."

TECHNICAL FIELD

Example embodiments relate to a flexible heat sink for an electronic component, such as a thermoelectric device and particularly a flexible thermoelectric device.

BACKGROUND

Heat sinks operate passively to dissipate heat away from an electronic component or mechanical device. Heat sinks generally provide greater surface areas for transferring heat to a surrounding medium, such as air. Heat sinks may be used in combination with thermoelectric devices to create a temperature controller. Some applications may warrant the use of a flexible thermoelectric device and also a flexible heat sink. Applications for a flexible heat sink may include, for example, a cooling assembly, or a heating and cooling assembly for a vehicle seat.

SUMMARY

According to one embodiment of the present application there is provided a flexible heat sink which includes a flexible base having a first side configured to engage a heat generating component, and a second side opposite the first side; and a plurality of groups of fins, each fin extending from the second side of the base. The groups of fins are positioned in an array and spaced apart lengthwise and width wise across the base, enabling the heat sink to flex lengthwise and width wise between the groups of fins

BRIEF DESCRIPTION OF THE DRAWINGS

Advantages of the present invention will be readily appreciated as the same becomes better understood by reference to the following detailed description when considered in connection with the accompanying drawings wherein.

Like reference numerals are used throughout the Figures to denote similar elements and features.

DETAILED DESCRIPTION OF EXAMPLE EMBODIMENTS

FIGS. 1 to 11 illustrate various heat sinks according to embodiments described herein. Directional references employed in the specification or claims, such as top, bottom, upper, lower, upward, downward, lengthwise, width wise, and the like, are employed for ease of description and are not intended to limit the scope of the invention in any respect. While many of the figures illustrate a heat sink with the fins extending towards the bottom of the figure, for example, it will be readily apparent that a heat sink according to the present disclosure may be oriented in any direction.

Figure 1:
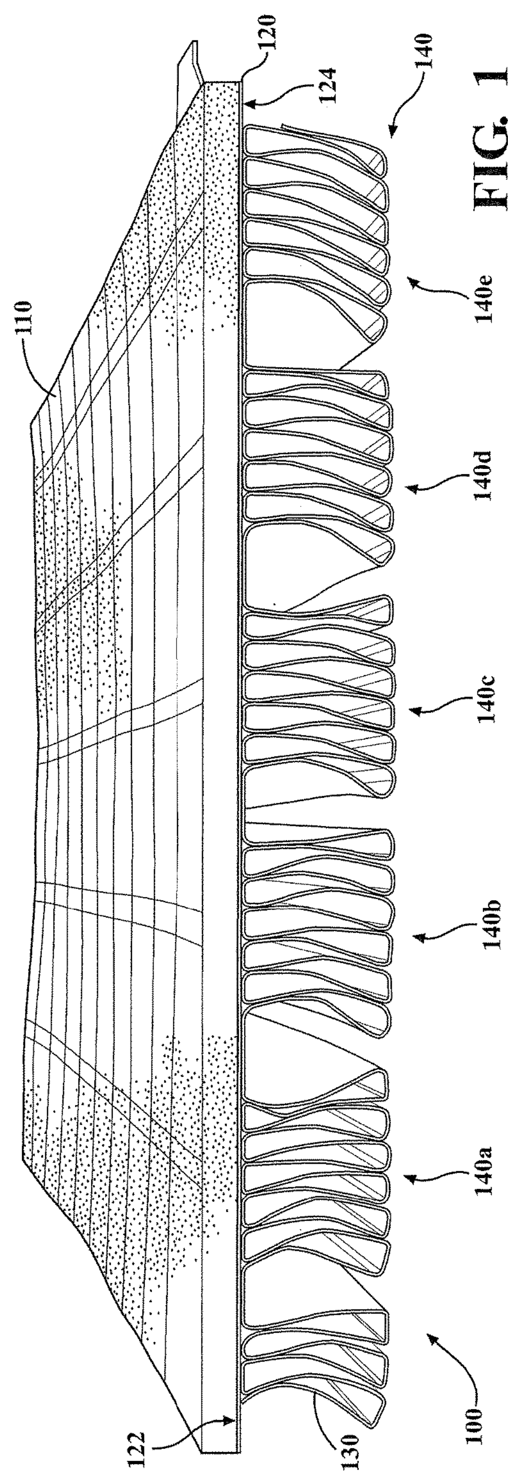
FIG. 1 is a top perspective view of a heat sink in accordance with one embodiment of the present disclosure.

FIGS. 1 to 4 illustrate a flexible heat sink 100 according to one embodiment of the present disclosure. The heat sink 100 may be used to cool a variety of electronic components or mechanical devices. As illustrated in FIG. 1, the heat sink 100 may be attached or mounted to a flexible thermoelectric module 110. Together, the heat sink 100 and thermoelectric module 110 may be used to create a temperature controller for use, for example, in a cooling apparatus, or heating and cooling apparatus, for a vehicle seat.

The heat sink 100 has a flexible base 120. The base 120 has a first side 122 which engages the device or component being cooled. The base 120 has a second side 124 opposite the first side 122. The second side 124 supports a plurality of heat sink fins 130. The fins 130 are walls or panels, as described below, which extend away from the second side of the base 124 and which operate to dissipate heat from the base 120 and thermoelectric module 110 to the surrounding environment.

The thermoelectric module 110 may be a flexible module made of various layers and substrates, such as polyimides, polyolefins, and silicone. Thus, the heat sink 100 is also flexible in order to conform to and flex with the module 110. In one embodiment, the base 120 is a thermally conductive flexible layer made of silicone or acrylic based material. The base 120 is thermally conductive but not conductive for electricity. The first side 122 of the base 120 may have an adhesive layer sufficient to attach the heat sink 100 to the module 110. The second side 124 also may include an adhesive layer for connecting or attaching the fins 130. In one embodiment, the base 120 is a 3M™ 8805 Series thermally conductive adhesive transfer tape. The fins 130 are made of a thermally conductive material, such as copper or aluminum. The material chosen may depend on the use of the heat sink 100. Copper has a slightly better performance due to a higher thermal conductivity but aluminum may be used for its lighter weight and lower cost. The height and thickness of the fins 130 also may be varied to allow the fins 130 to flex, depending on the requirements of the device, component or application for which the heat sink 100 is used.

Figure 2:
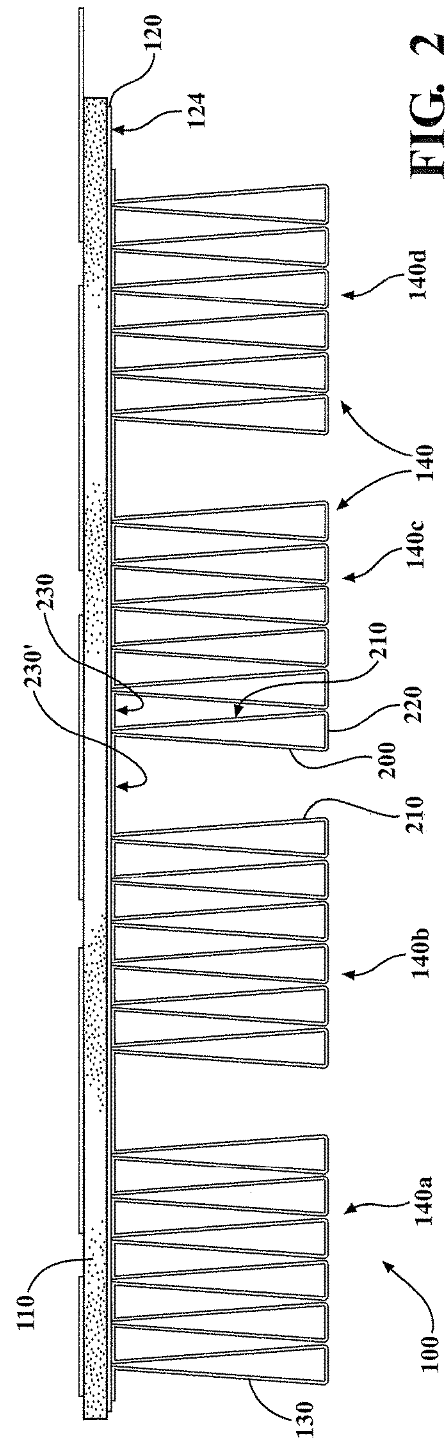
FIG. 2 is a front view of the heat sink.
Figure 3:
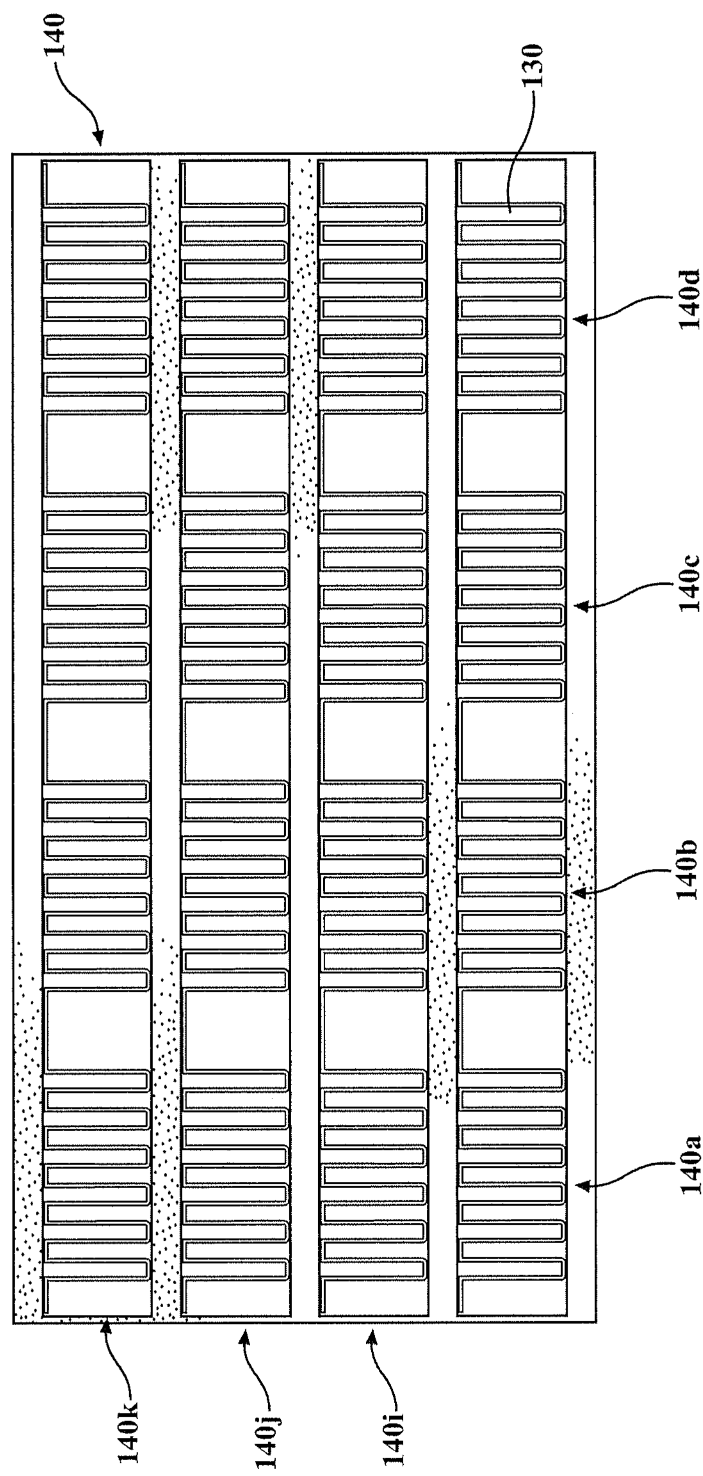
FIG. 3 is a bottom view of the heat sink.
Figure 4:
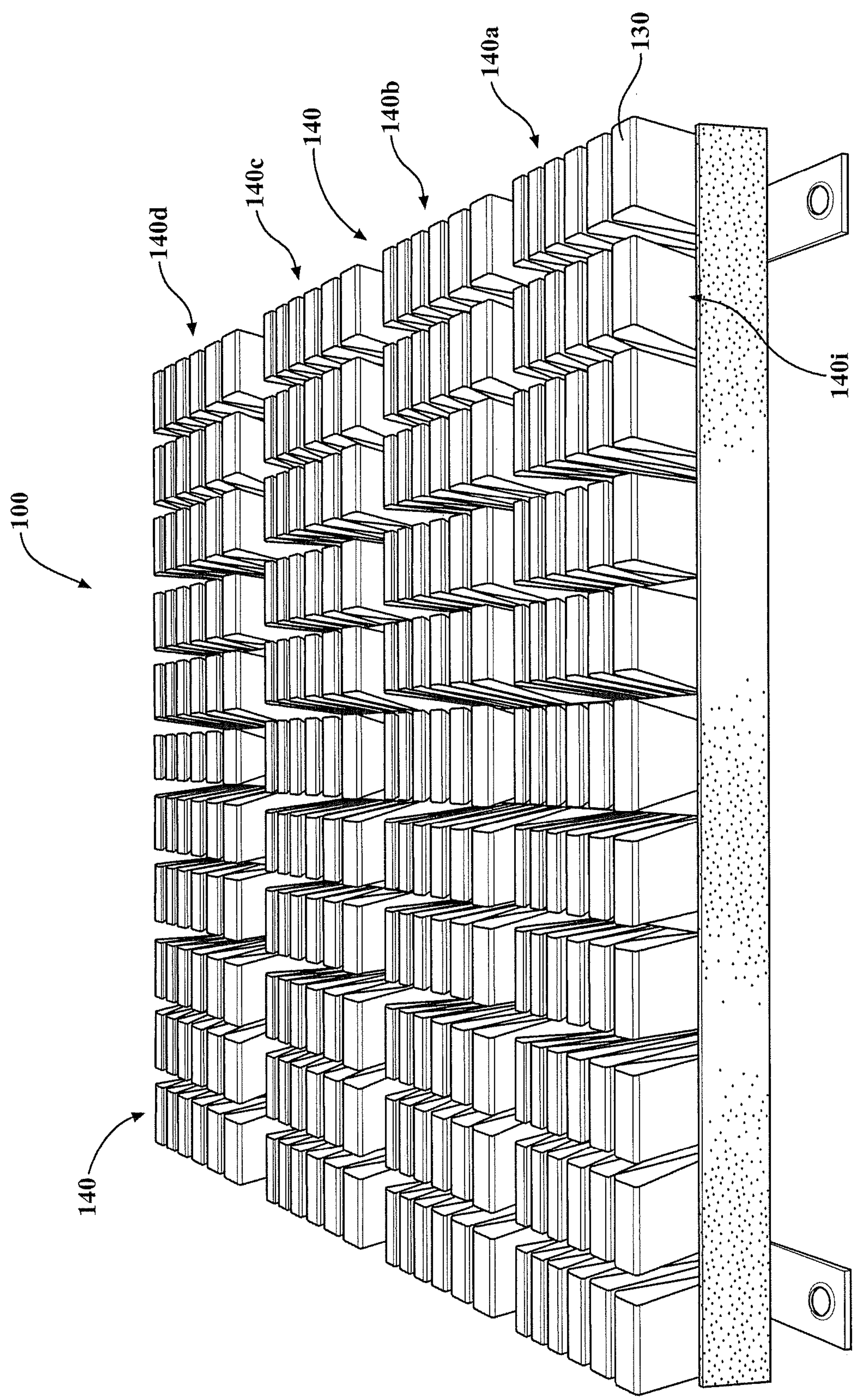
FIG. 4 is a bottom perspective view of the heat sink.

As shown in FIGS. 1 to 4, the fins 130 are arranged in groups 140, shown as groups 140*a*, 140*b*, 140*c*, 140*d*, 140*e* in FIG. 1. The groups 140 are positioned or arranged in an array to provide groups 140 of fins 130 across the length and width of the heat sink 100. In one embodiment, the groups 140 may be arranged in a rectangular grid pattern with rows and columns of groups 140 at right angles. As shown in FIG. 3, for example, sixteen groups 140 may be arranged in four rows across the width of the heat sink 100, with groups 140*a*, 140*i*, 140*j*, 140*k* at the start of the rows. In this example, each row has four groups 140 of fins 130. In other words, the heat sink 100 includes four columns of groups 140, with groups 140*a*, 140*b*, 140*c*, 140*d* at the start of the columns. FIG. 4 illustrates a bottom perspective view of a different example and a different orientation of the heat sink 100 with eleven rows and four columns of groups 140 of fins 130. Groups 140*a*, 140*b*, 140*c*, 140*d* are indicated at the start of the columns in FIG. 4. The size of the heat sink 100, the number of groups 140, and the number and arrangement of rows and columns, may be configured depending on the requirements of the device, component or application for which the heat sink 100 is used.

Specifically, with the arrangement of spaced apart groups 140 of fins 130, and the flexible base 120, the heat sink 100 is able to flex lengthwise between the groups 140. The rows are also spaced apart, as seen in FIG. 3, to enable the heat sink 100 to flex between each row. The spaced arrangement and number of fins 130 in each group 140 may be configured to achieve different levels of flex and heat dissipation depending on the application for which the heat sink 100 is used. Specifically, the number of fins 130 per group can be increased to increase surface area and thus increase potential heat transfer. Additionally, the configuration and size of each fin 130 may be changed to suit the application and allow for additional flexing. In some embodiments, the heat sink 100 may include four to six fins 130 per group 140. Each group 140 may occupy a space of 10 to 20 mm along the length of the heat sink 100. The fins 130 may be 15 to 20 mm in height and 0.005" to 0.010" in thickness. Increasing the thickness of the fin material provides greater stiffness of the fins 130 but at the detriment of cost, weight and a greater heat capacity. In some embodiments, an additional fin (not shown) which is shorter in height than the fins 130 may be positioned between groups 140 of fins 130 in a row. The additional fin provides a hinge point to obtain additional flexibility between the two groups 140 of fins. One or more additional fins may be included with a ganged assembly of multiple fin groups 140 manufactured out of a single piece of material while still maintaining the targeted flexibility between each group 140.

It will be appreciated that the heat sink 100 may be constructed with a base 120 which is one layer of material sized to accommodate the rows and columns of groups 140 of fins 130. In some embodiments, the base 120 may be formed by connecting sections of the base portion, with each section supporting a row or column of groups 140 of fins 130. In other embodiments, the base sections may be mounted or attached to the device or component being cooled, with each base section being adjacent to and aligned with a neighbouring base section.

Figure 5:
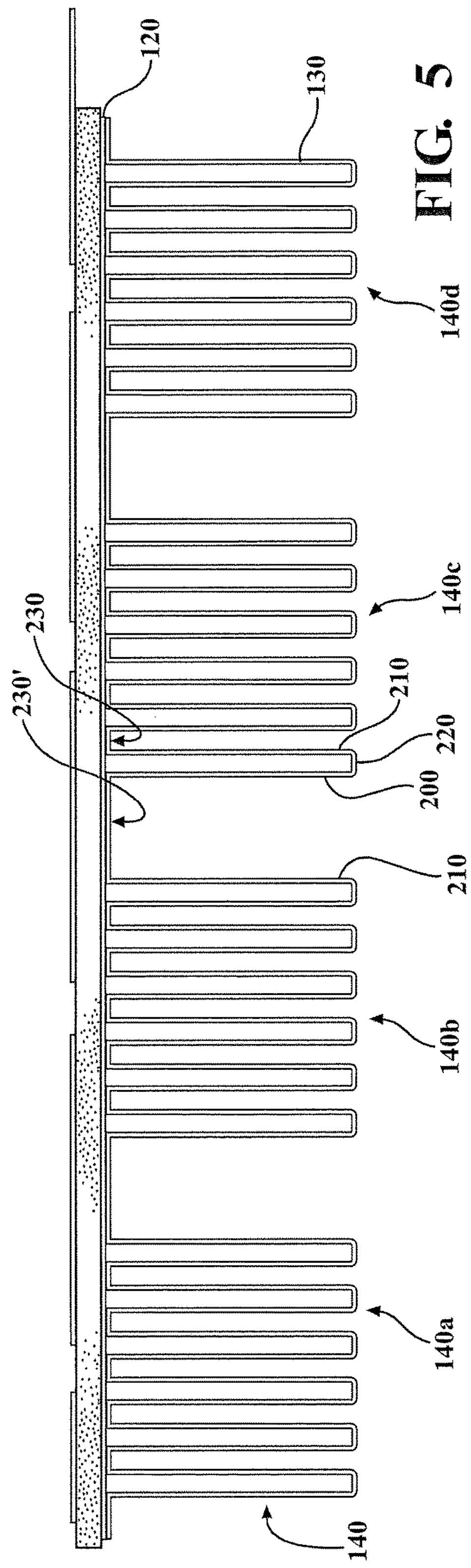
FIG. 5 is a front view of a heat sink in accordance with another embodiment of the present disclosure.
Figure 6:
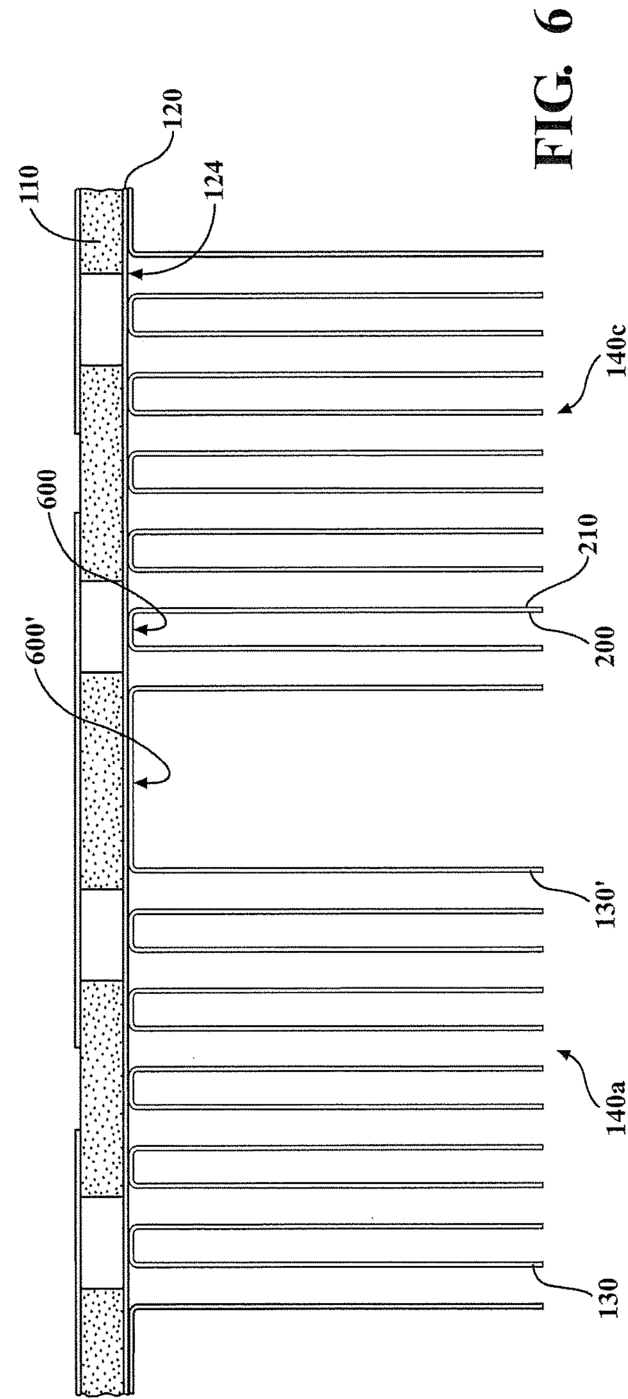
FIG. 6 is a front view of a heat sink in accordance with another embodiment of the present disclosure.

Different configurations of fins 130 for the heat sink 100 may be seen in FIGS. 2, 5 and 6. As shown in FIG. 2, each fin 130 may include a first wall 200 and a second wall 210. Each wall 200, 210 extends away from the second side 124 of the base 120. The walls 200, 210 extend away from each other and are joined at the outer ends of the walls 200, 210 by a first panel 220. The first panel 220 is generally parallel to the base 120. The walls 200, 210 and panel 220 thus create a fin 130 defining a triangular shaped channel. In one embodiment, each fin 130 is connected to an adjacent fin 130 in the heat sink 100 by a second panel 230. The second panel 230 connects an inner end of each wall 200, 210, the inner ends being adjacent the base 120 and opposite the outer ends. The second panel 230 is generally parallel to the base 120 and as shown in the figures, is adjacent to the base 120. Typically, the second panel 230 is attached to the second side 124 of the base 120. It will be appreciated that in one embodiment, each row of fins 130 may constructed as groups 140 of folded fins from a single piece of material. The second panel between adjacent groups 140 of fins 130 is longer than the second panel between fins 130 within a group 140. This is illustrated in FIG. 2 in which the second panel 230' connects the second wall 210 of the last fin 130 in group 140*b* to the first wall 200 of the first fin 130 in adjacent group 140*c*. The second panel 230' is longer than the second panel 230 to provide the spacing between groups of fins 140.

In FIG. 5, the fins 130 are shown with a rectangular shaped construction. Specifically, the walls 200, 210 extend away from the second side 124 of the base 120 and are parallel to each other. The walls 200, 210 are joined at the outer ends of the walls 200, 210 by the first panel 220. The first panel 220 is generally parallel to the base 120. The walls 200, 210 and panel 220 thus create a fin 130 defining a rectangular shaped channel. As described above, the inner ends of each wall 200, 210, may be connected by the second panel 230 adjacent the base 120. In one embodiment, each row of fins 130 may constructed as groups 140 of folded fins from a single piece of material with the second panels 230' between adjacent groups 140 of fins 130 being longer than the second panels 230 between fins 130 within each group. The configuration of the second panels 230' between the groups 140 of fins 130 allows for a one-piece construction for the row of fins 130. The second panels 230' also provide more surface area for contacting the heat source, such as the thermoelectric module 110, through the base 120. Similarly, although the rectangular shaped configuration of fins 130 in FIG. 5 allows for even airflow and easier assembly, the pinched or triangular fins 130 in FIG. 2 create a larger surface area for contacting the heat source. It will also be appreciated that the shape of the channel provided by each fin 130 may be altered in use as the heat sink 100 flexes with the flex of the component or device to which it is attached.

A third configuration of fins 130 can be seen in FIG. 6. In this embodiment, the first wall 200 and second wall 210 extend away from the second side 124 of the base 120 and are parallel to each other. A third panel 600 connects an inner end of each wall 200, 210, the inner ends being adjacent the base 120. The third panel 600 is generally parallel to and adjacent or connected to the second side 124 of the base 120. The first and second walls 200, 210 and the third panel 600 thus define a u-shaped channel with the open end of the "u" at the outer ends of the walls 200, 210. In one embodiment, a fin 130' is configured to span the space between the groups 140*b*, 140*e* of fins 130. The fin 130' includes a third panel 600' which is longer than the third panels 600 of the fins 130 within each group 140. The fins 130' which span adjacent groups 140 create a larger surface area with third panels 600' for contacting the heat source through the base 120.

Figure 7:
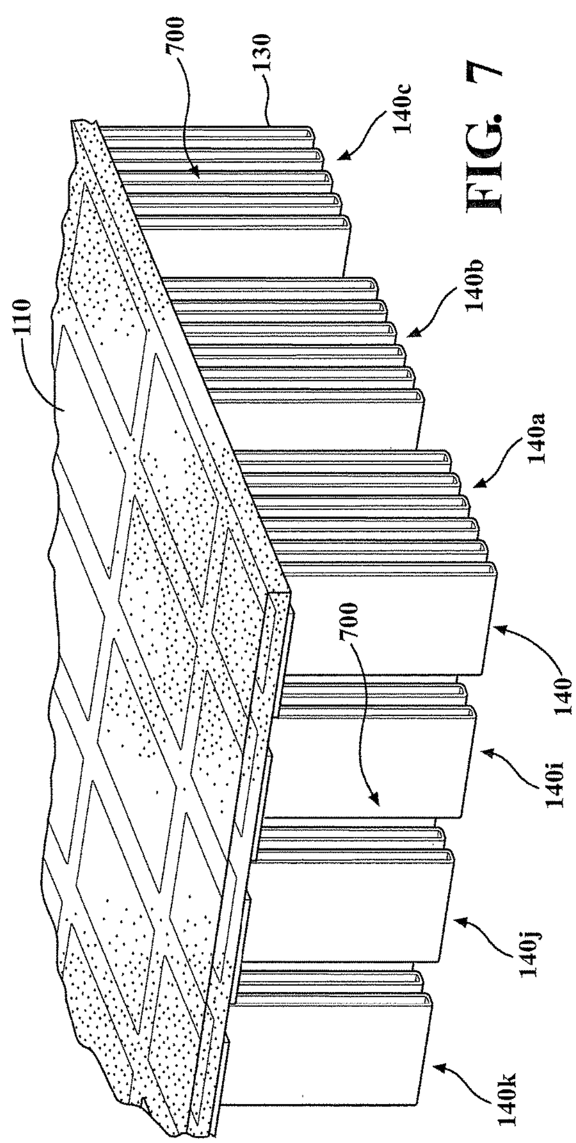
FIG. 7 is a perspective view of the heat sink of FIG. 5.
Figure 8:
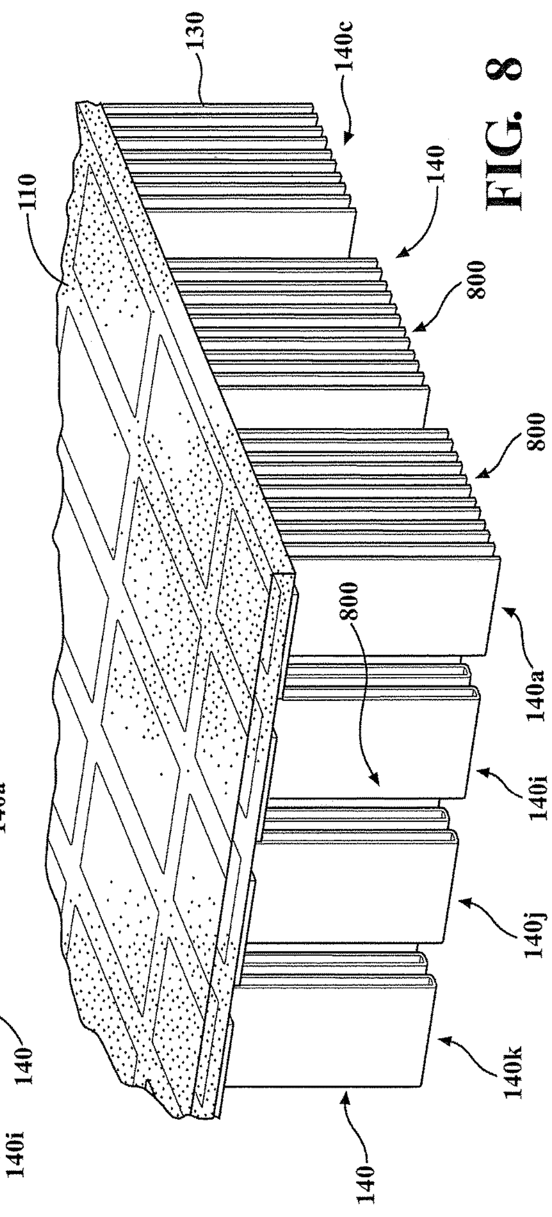
FIG. 8 is a perspective view of the heat sink of FIG. 6.

The different shapes and configurations of fins 130 enable different air flow patterns as seen in FIGS. 7 and 8. Air is typically moved through the fins 130 via a blower unit (not shown), as is commonly known in the art. FIG. 7 shows a configuration to use when the blower inlet orientation is parallel to the base 120. With fins 130 having a triangular or rectangular shaped construction as shown in FIGS. 2 and 5, air may flow or be directed parallel to the walls 200, 210 of fins 130 and through the triangular or rectangular shaped channels. This is shown by the arrows 700 in FIG. 7. FIG. 8 shows a configuration to use when the blower inlet orientation is perpendicular to the base 120. With the configuration of fins 130 defining u-shaped channels as shown in FIG. 6, the inlet air direction may be perpendicular to the base 120 to allow perpendicular air flow at the inlet. The other groups 140 of fins 130 of the heat sink 100 have a rectangular or triangular shaped construction to enable continued air flow parallel to the walls 200, 210 of the fins 130 and through the channels defined by the fins 130. This embodiment is illustrated in FIG. 8 by arrows 800. The groups 140*a*, 140*b*, 140*c* have fins 130 with u-shaped channels. The groups 140*i*, 140*j*, 140*k*, and the other groups 140 in those rows (not shown) have fins 130 with rectangular shaped channels.

Figure 9:
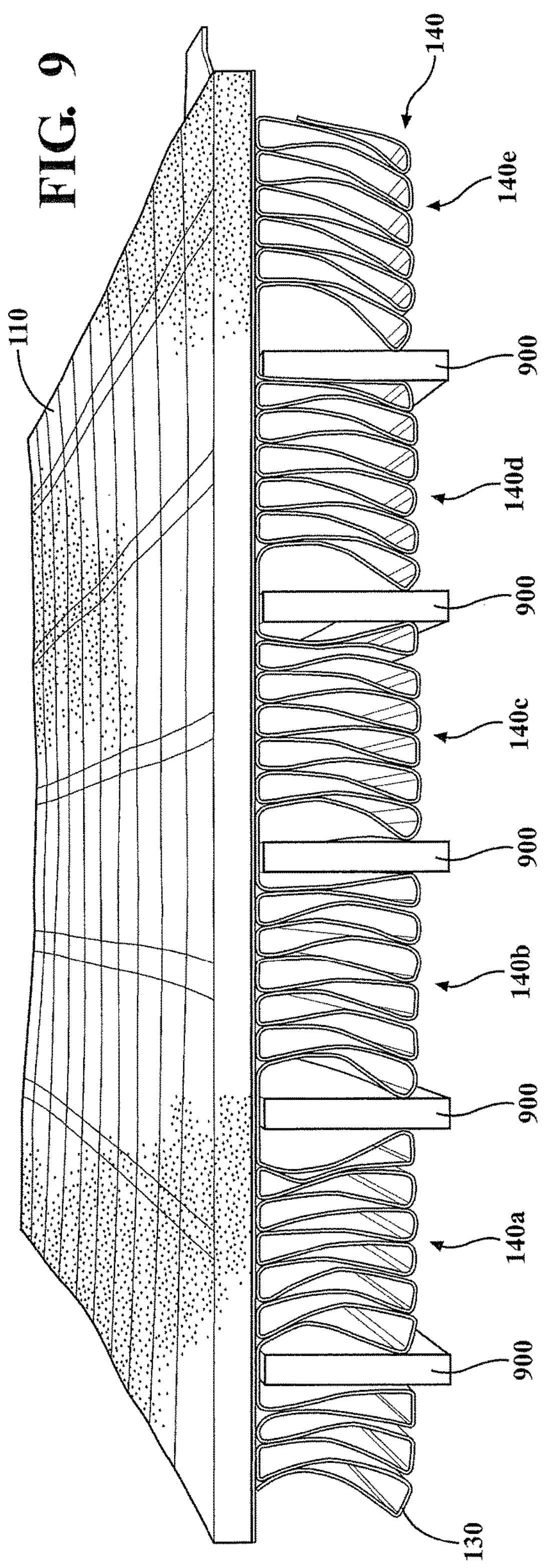
FIG. 9 is a front perspective view of a heat sink in accordance with another embodiment of the present disclosure.
Figure 10:
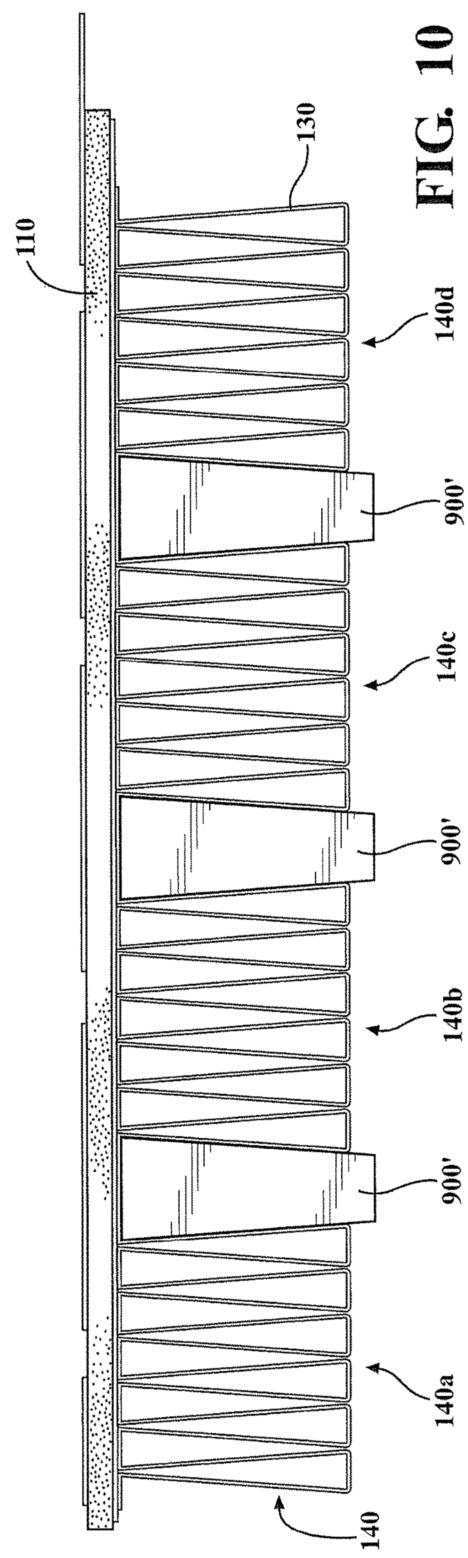
FIG. 10 is a front view of a heat sink in accordance with another embodiment of the present disclosure.

The shape of the channel defined by each fin 130 may change in use as the fins 130 and heat sink 100 flex or are compressed with the flex or movement of the component or device to which the heat sink 100 is attached. In some embodiments, as seen in FIGS. 9 and 10, the heat sink 100 includes one or more additional structural members 900 so that the primary mechanical load on the heat sink 100 bypasses the fins 130. In some embodiments, the structural members 900 have a height slightly greater than the height of the fins 130, The structural members 900 may also create a more consistent air channel to aid in achieving an even airflow. As seen in FIGS. 9 and 10, the structural members 900 are positioned parallel to the walls 200, 210 of the fins 130 in the space between two columns of groups 140. The structural member 900 may consist of length of flexible material with limited compressibility such as rubber or silicone. The geometry and durometer of the members 900 may be selected to obtain the desired firmness or force versus deflection properties for the particular use or application of the heat sink 100. The structural members 900 may comprise different shapes, such as a solid rectangular member or strip seen in FIG. 9, or an extruded member 900' defining a trapezoid shaped channel, as seen in FIG. 10.

Figure 11:
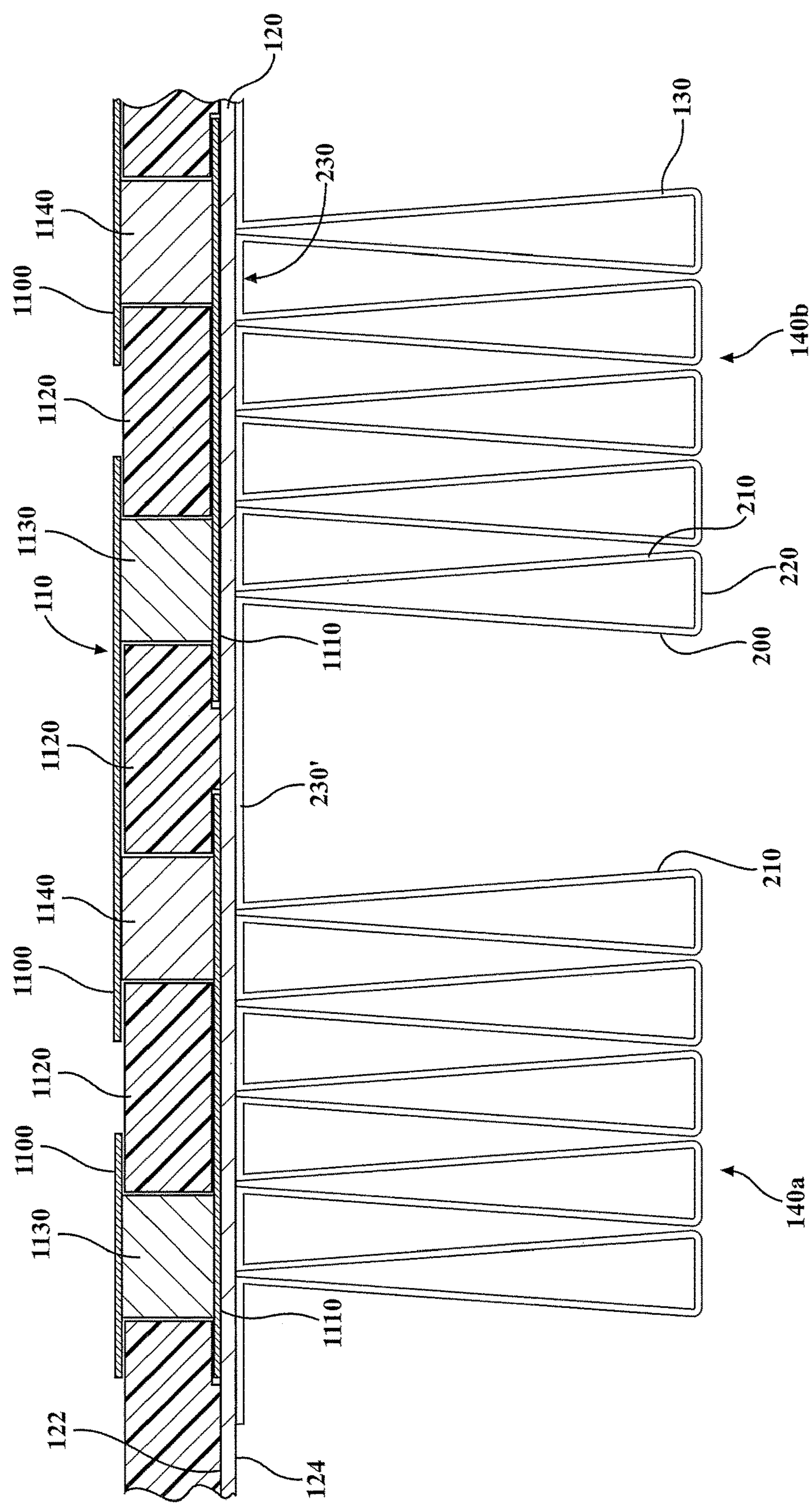
FIG. 11 is a front view of a heat sink in accordance with another embodiment of the present disclosure.

As noted above, the flexible heat sink 100 may be used and connected to a flexible thermoelectric module 110. In some embodiments, as can be seen in FIG. 11, the heat sink 100 is configured to match the flexing sections of the thermoelectric module 110 and also provide contact with as much surface area of the module 110 as possible. FIG. 11 illustrates a heat sink 100 with a base 120 and fins 130 as described above and as shown in FIG. 2. The thermoelectric module 110 includes a top bus bar 1100, a bottom bus bar 1110, sections 1120 of isolator material, and sections of thermoelectric material arranged in an array. Sections 1130 of P-type thermoelectric materials and sections 1140 of N-type thermoelectric materials alternate with the sections 1120 of isolator material. In this embodiment, the heat sink 100 is configured with groups 140*a*, 140*b* of fins 130 which are sized and spaced apart to match the locations of the bottom bus bars 1110 of the thermoelectric module 110 in order to dissipate heat. The spacings between groups 140 of fins 130 also correspond to gaps between the bottom bus bars 1110, allowing the heat sink 100 to flex and match the flex of the thermoelectric module 110. The array, or spaced apart rows and columns of groups 140 of fins 130, thus enables the heat sink 100 to flex lengthwise and width wise with the thermoelectric module 110.

The invention has been described in an illustrative manner, and it is to be understood that the terminology, which has been used, is intended to be in the nature of words of description rather than of limitation. Many modifications and variations of the present invention are possible in light of the above teachings. It is, therefore, to be understood that within the scope of the appended claims, the invention may be practiced other than as specifically described.

The invention claimed is:

1. A flexible heat sink comprising:

a flexible base having a first side configured to engage a heat generating component, and a second side opposite the first side;

a plurality of groups of fins, each fin extending from the second side of the base; and the groups of fins positioned in an array and spaced apart lengthwise and width wise across the base, enabling the heat sink to flex lengthwise and width wise between the groups of fins; wherein each fin comprises first and second walls extending from the second side of the base and parallel to each other, a first panel parallel to the base, the first panel connecting an outer end of the first wall to an outer end of the second wall to define a rectangular shaped channel, a plurality of second panels parallel and adjacent to the second side of the base, each second panel connecting an inner end of the second wall of one fin to an inner end of the first wall of an adjacent fin, and wherein each lengthwise section of groups comprises fins constructed from a single piece of material and wherein the second panel connecting fins of adjacent groups is longer than the second panels connecting adjacent fins within each group.

2. The flexible heat sink of claim 1 wherein the array comprises a rectangular grid.

3. The flexible heat sink of claim 1 wherein each fin comprises a flexible, thetinally conductive material.

4. The flexible heat sink of claim 1 wherein the flexible base comprises a thermally conductive flexible tape.

5. The flexible heat sink of claim 1 wherein each group of fins comprises four to six fins.

6. The flexible heat sink of claim 1 further comprising at least one structural member positioned parallel to the fins and extending width wise across the heat sink between groups of fins, wherein the structural member extends from the second side of the base and projects past the outer ends of the first and second walls of the fins to structurally support the flexible heat sink.

7. A flexible heat sink comprising:

a flexible base having a first side configured to engage a heat generating component, and a second side opposite the first side;

a plurality of groups of fins, each fin extending from the second side of the base; and the groups of fins positioned in an array and spaced apart lengthwise and width wise across the base, enabling the heat sink to flex lengthwise and width wise between the groups of fins; wherein each fin comprises first and second walls extending from the second side of the base and away from each other, and a first panel parallel to the base, the first panel connecting an outer end of the first wall to an outer end of the second wall to define a triangular shaped channel.

8. The flexible heat sink of claim 7 further comprising a plurality of second panels parallel and adjacent to the second side of the base, each second panel connecting an inner end of the second wall of one fin to an inner end of the first wall of an adjacent fin.

9. The flexible heat sink of claim 8 wherein each lengthwise section of groups comprises fins constructed from a single piece of material and wherein the second panel connecting fins of adjacent groups is longer than the second panels connecting adjacent fins within each group.

10. The flexible heat sink of claim 7 further comprising at least one structural member positioned parallel to the fins and extending width wise across the heat sink between groups of fins, wherein the structural member extends from the second side of the base and projects past the outer ends of the first and second walls of the fins to structurally support the flexible heat sink.

* * * * *